(12) United States Patent
Lester et al.

(10) Patent No.: US 8,384,099 B2
(45) Date of Patent: Feb. 26, 2013

(54) GAN BASED LED HAVING REDUCED THICKNESS AND METHOD FOR MAKING THE SAME

(75) Inventors: Steven D. Lester, Palo Alto, CA (US); Frank T. Shum, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 57 days.

(21) Appl. No.: 12/860,162

(22) Filed: Aug. 20, 2010

(65) Prior Publication Data

US 2012/0032183 A1 Feb. 9, 2012

Related U.S. Application Data

(63) Continuation of application No. 11/761,223, filed on Jun. 11, 2007, now Pat. No. 7,791,090.

(51) Int. Cl.
*H01L 29/206* (2006.01)

(52) U.S. Cl. .............. 257/91; 257/95; 257/98; 257/99; 257/E33.001

(58) Field of Classification Search .............. 257/91, 257/95, 98, 99, E33.001
See application file for complete search history.

(56) References Cited

U.S. PATENT DOCUMENTS

2005/0258435 A1* 11/2005 Frchak et al. ............. 257/79

* cited by examiner

*Primary Examiner* — Tan N Tran
(74) *Attorney, Agent, or Firm* — Calvin B. Ward

(57) ABSTRACT

A device having a carrier, a light-emitting structure, and first and second electrodes is disclosed. The light-emitting structure includes an active layer sandwiched between a p-type GaN layer and an n-type GaN layer, the active layer emitting light of a predetermined wavelength in the active layer when electrons and holes from the n-type GaN layer and the p-type GaN layer, respectively, combine therein. The first and second electrodes are bonded to the surfaces of the p-type and n-type GaN layers that are not adjacent to the active layer. The n-type GaN layer has a thickness less than 1.25 μm. The carrier is bonded to the light emitting structure during the thinning of the n-type GaN layer. The thinned light-emitting structure can be transferred to a second carrier to provide a device that is analogous to conventional LEDs having contacts on the top surface of the LED.

3 Claims, 4 Drawing Sheets

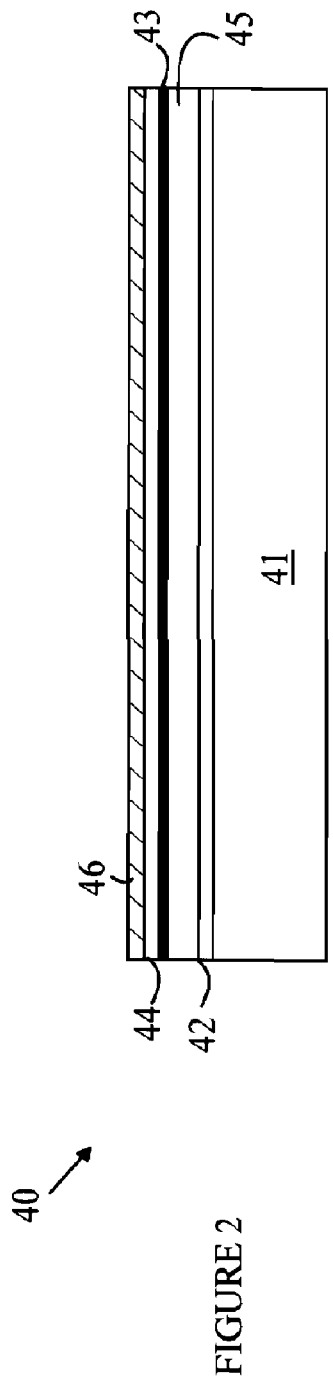
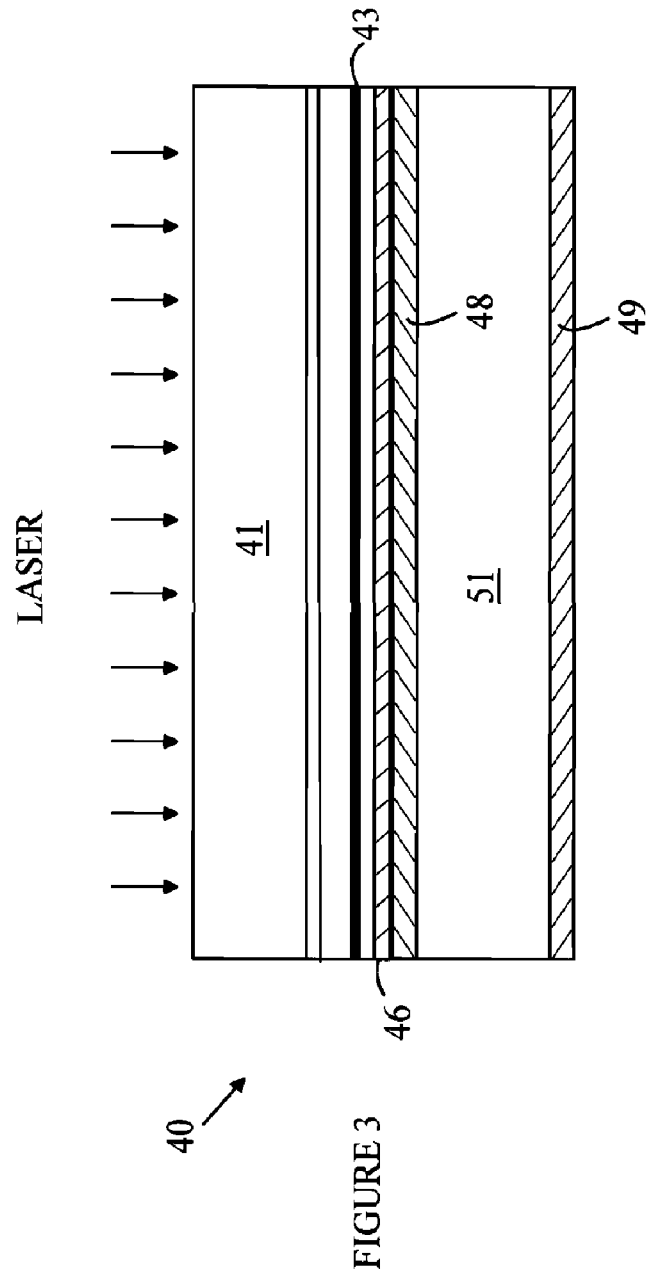

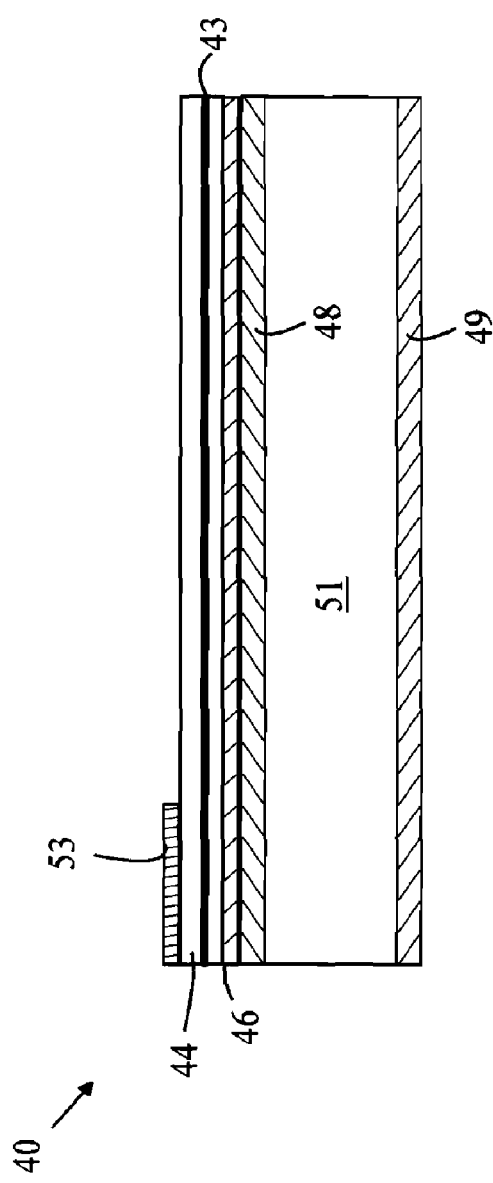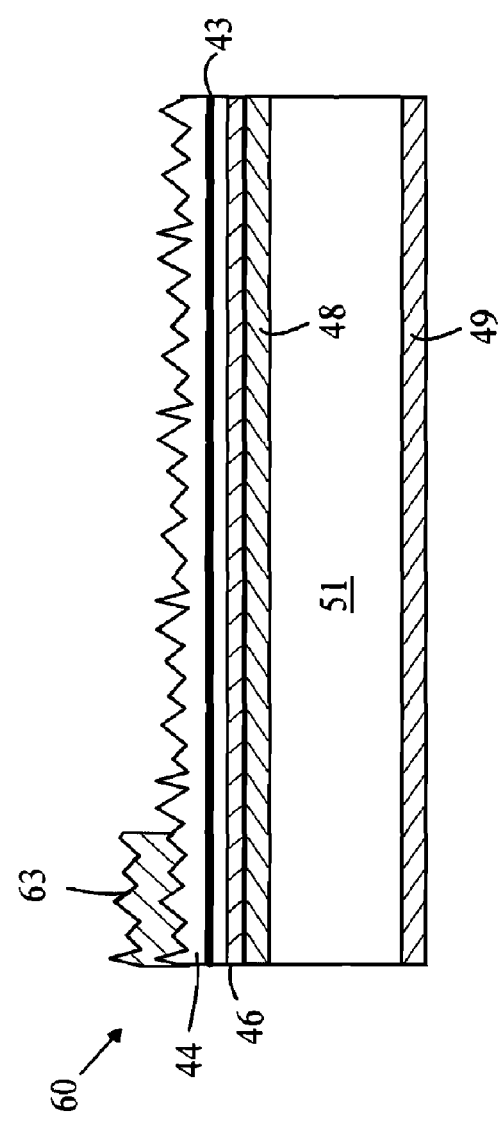

GAN BASED LED HAVING REDUCED THICKNESS AND METHOD FOR MAKING THE SAME

CROSS REFERENCE TO RELATED APPLICATIONS

This is a continuation of application Ser. No. 11/761,223 filed on Jun. 11, 2007, now issued as U.S. Pat. No. 7,791,090 on Sep. 7, 2010.

BACKGROUND OF THE INVENTION

Light emitting devices (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

The cost and conversion efficiency of LEDs are important factors in determining the rate at which this new technology will replace conventional light sources and be utilized in high power applications. Many high power applications require multiple LEDs to achieve the needed power levels. Individual LEDs are limited to a few watts. In addition, LEDs generate light in relatively narrow spectral bands. Hence, in applications requiring a light source of a particular color, the light from a number of LEDs with spectral emission in different optical bands is combined. Hence, the cost of many light sources based on LEDs is many times the cost of the individual LEDs.

The conversion efficiency of individual LEDs is an important factor in addressing the cost of high power LED light sources. Electrical power that is not converted to light in the LED is converted to heat that raises the temperature of the LED. Heat dissipation places a limit on the power level at which an LED operates. In addition, the LEDs must be mounted on structures that provide heat dissipation, which, in turn, further increases the cost of the light sources. Hence, if the conversion efficiency of an LED can be increased, the maximum amount of light that can be provided by a single LED can also be increased, and hence, reduce the number of LEDs needed for a given light source. In addition, the cost of operation of the LED is also inversely proportional to the conversion efficiency. Hence, there has been a great deal of work directed to improving the conversion efficiency of LEDs.

The spectral band generated by an LED, in general, depends on the materials from which the LED is made. LEDs commonly include an active layer of semiconductor material sandwiched between additional layers. For the purposes of this discussion, an LED can be viewed as having three layers, the active layer sandwiched between two other layers. These layers are typically deposited on a substrate such as sapphire. It should be noted that each of these layers typically includes a number of sub-layers. The final LED chip is often encapsulated in a clear medium such as epoxy. To simplify the following discussion, it will be assumed that the light that leaves the LED exits through the outer layer that is furthest from the substrate. This layer will be referred to as the top layer in the following discussion.

Improvements in materials have led to improvements in the efficiency of light generated in the active layer. However, a significant fraction of the light generated in the active layer is lost. Most of this light is lost through absorption in the various layers used to construct the LED. This mode of light loss is aggravated by the trapping of much of the light within the LED structure. Light that is generated in the active layer must pass through the top layer before exiting the LED. Since the active layer emits light in all directions, the light from the active region strikes the boundary between the top layer and the encapsulating material at essentially all angles from 0 to 90 degrees relative to the normal direction at the boundary. Light that strikes the boundary at angles that are greater than the critical angle is totally reflected at the boundary. This light is redirected toward the substrate and is likewise reflected back into the LED. As a result, the light is trapped within the LED until it strikes the end of the LED or is absorbed by the material in the LED. In the case of conventional GaN-based LEDs on sapphire substrates approximately 70% of the light emitted by the active layer is trapped between the sapphire substrate and the outer surface of the GaN.

Several techniques have been described to improve light extraction from LEDs, and hence, improve the light conversion efficiency of these devices. In one class of techniques, the top surface of the LED is converted from a smooth planar surface to a rough surface. Some of the light that is reflected at the top surface will return to the top surface at a location in which that light is now within the critical angle, and hence, escape rather than being again reflected. In a second class of techniques, the thickness of the LED is increased to reduce the number of times the trapped light is forced to travel through the active region before the trapped light exits the LED through one of the end surfaces.

SUMMARY OF THE INVENTION

The present invention includes a device having a first carrier, a light-emitting structure, and first and second electrodes. The light-emitting structure is bonded to the carrier and includes an active layer sandwiched between a p-type GaN layer and an n-type GaN layer, the active layer emitting light of a predetermined wavelength in the active layer when electrons and holes from the n-type GaN layer and the p-type GaN layer, respectively, combine therein. The first electrode is attached to a surface of the p-type GaN layer that is not adjacent to the active layer, and the second electrode is attached to a surface of the n-type GaN layer that is not adjacent to the active layer. The n-type GaN layer has an average thickness less than 1.25 µm. The final device could include a second carrier bonded to the thinned n-type GaN layer in place of the first carrier.

BRIEF DESCRIPTION OF THE DRAWINGS

FIGS. 2-4 are cross-sectional views of a portion of a wafer on which an LED according to one embodiment of the present invention is fabricated at various stages in the fabrication process.

FIG. 5 is a cross-sectional view of another embodiment of an LED according to the present invention.

DETAILED DESCRIPTION OF THE PREFERRED EMBODIMENTS OF THE INVENTION

Figure 1:
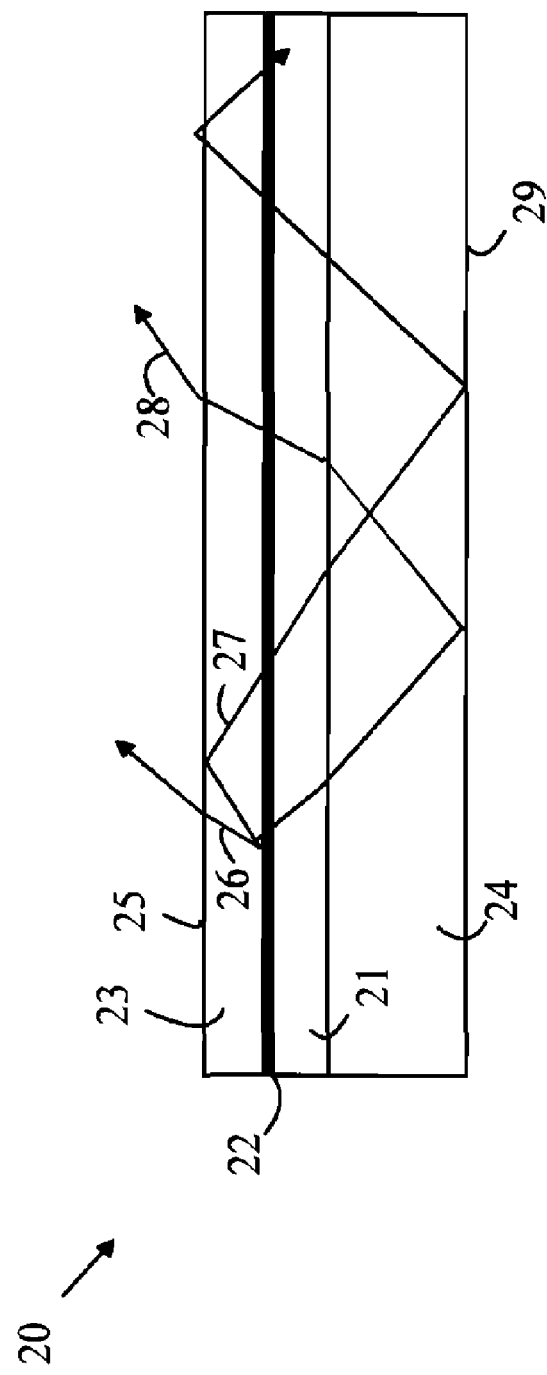
FIG. 1 is a simplified cross-sectional view of a prior art GaN-based LED.

The manner in which the present invention provides its advantages can be more easily understood with reference to FIG. 1, which is a simplified cross-sectional view of a prior art GaN-based LED. LED 20 is constructed by growing three layers on a sapphire substrate 24. The first layer 21 is an n-type GaN material. The second layer is a p-type GaN layer 23. The third layer 22 is an active layer that emits light when holes and electrons from layers 21 and 23 combine therein. As noted above, each of these layers may include a number of sub-layers. Since the functions of these sub-layers are well known in the art and are not central to the present discussion, the details of these sub-layers have been omitted from the drawings and the following discussion.

As noted above, light that is generated in layer 22 leaves layer 22 at all possible angles. Some of the light is emitted in a direction toward the top surface 25 of layer 23 and strikes surface 25 at angles that are less than the critical angle and escapes through surface 25. Such a light ray is shown at 26. Similarly, some of the light is directed toward substrate 24 and is reflected from the bottom of the substrate before reflecting back to surface 25. If this light strikes surface 25 at angles less than the critical angle, this light also escapes through surface 25. An exemplary light ray of this type is shown at 28. Unfortunately, most of the light generated in layer 22 strikes surface 25 at angles that are greater than the critical angle as shown at 27 and becomes trapped between surface 25 and surface 29. This light will either be absorbed during its transit or exit through the ends of the LED. In practice, most of the trapped light is absorbed, and hence, lost. As a result, the efficiency of LED 20 is poor.

One embodiment of the present invention utilizes a vertical LED structure with reduced thickness to reduce the amount of light that is absorbed in the GaN layers. Refer now to FIGS. 2-4, which illustrate the manner in which an LED according to this embodiment of the present invention is constructed. FIGS. 2-4 are cross-sectional views of a portion of a wafer on which an LED according to this embodiment of the present invention is fabricated. The fabrication process begins with the deposition of the various layers on a sapphire substrate 41. Since the deposition of these layers is conventional in the art, the deposition will not be discussed in detail here. For the purposes of the present discussion it is sufficient to note that a buffer layer 42 is deposited on substrate 41 to reduce the dislocations created by the difference between the lattice constant of sapphire and that of the GaN based materials. Next, the n-type GaN layer 45 is deposited on buffer layer 42. This layer includes a number of sub-layers that perform functions that are not of importance to the present discussion. Next, the active layer 43 is deposited on layer 45. Once again, this layer typically includes a number of sub-layers. Next, the p-type layer 44, which also includes a number of sub-layers, is deposited on active layer 43. An electrode layer 46 is then deposited over layer 44. The nature of the electrode layer depends on whether or not light is extracted through the electrode layer.

After the various layers discussed above have been deposited, the wafer is turned upside down and bonded to a carrier 51 as shown in FIG. 3. Carrier 51 can include an electrode 48 that is bonded to electrode layer 46 and provides a connection between electrode layer 46 and electrode layer 49 on the bottom surface of carrier 51. In one embodiment, carrier 51 is constructed from a conducting material such as silicon or a metal.

After the wafer containing the LED layers is bonded to carrier 51, substrate 41 is removed. The wafer can be removed by heating the GaN layer adjacent to the sapphire substrate to a temperature that causes the Ga to liquefy. The GaN is typically heated by exposing the interface between layer 42 and substrate 41 to light from a laser having a wavelength that is absorbed by GaN but not by sapphire. This technique is described in detail in U.S. Pat. No. 6,420,242, which is hereby incorporated by reference. Other methods such as etching or grinding can also be used.

After removing the sapphire substrate, the n-GaN layers are thinned to a thickness of less than 1.25 μm and preferably, a thickness between 1 μm and 1.25 μm by removing the exposed n-type GaN material. The GaN can be removed by etching using inductively-coupled plasma (ICP) etching or by chemical etching with solutions of KOH or NaOH, by photoelectochemical etching, and/or polishing. Finally, an electrode 53 is deposited on the thinned n-type GaN. The electrode can be constructed from ITO if light is to be extracted through the electrode.

It should be noted that all of the processing described above can be performed at the wafer scale. Hence, wafer-scale economies of scale can be achieved. After the wafer scale processing is completed, the individual dies are singulated by cutting the carrier 51 and the overlying layers. The device can then be powered by attaching electrode 49 to one contact on a printed circuit board in a lead frame and wire bonding a connection to electrode 53 to provide the other connection.

As noted above, light extraction is a problem with LEDs constructed from materials in the GaN family of materials. To improve the light extraction from LED 40, the exposed n-type GaN can be etched prior to depositing electrode 53 to provide a rough surface that has improved light extraction efficiency. In this regard, it should be noted that the crystal face is adjacent to the sapphire substrate when the epitaxially grown material is deposited on the N-face of the GaN crystal. This face can be etched using conventional KOH etching techniques to provide the roughened surface needed to improve light extraction without requiring that a lithographic mask be patterned on the surface. The Ga face that is exposed during growth of the p-type layers, in contrast, cannot be easily etched. Hence, the present invention also provides a convenient mechanism for improving the light extraction of the LED.

Refer now to FIG. 5, which is a cross-sectional view of another embodiment of an LED according to the present invention. LED 60 is similar to LED 40 discussed above, and hence, those elements that serve functions analogous to functions served by elements in LED 40 have been given the same numeric designations. LED 60 utilizes an n-type layer 45 that has been etched prior to the deposition of the electrode material to provide a roughened electrode 63. The surface adjacent to electrode 63 includes scattering features having dimensions greater than the minimum wavelength of light generated in the active layer.

The roughening of the surface of the n-GaN preferably creates scattering features in the range of 0.1 μm to 2 μm. These features can be protrusions or depressions in the surface. In the case of a roughened surface, the n-GaN layers are thinned such that the final n-GaN layers after being roughened have an average thickness of 1.25 μm and a minimum thickness of 0.5 microns. This assures that there is sufficient remaining material to protect the active region and provide current spreading within the n-GaN layers.

Figure 6:
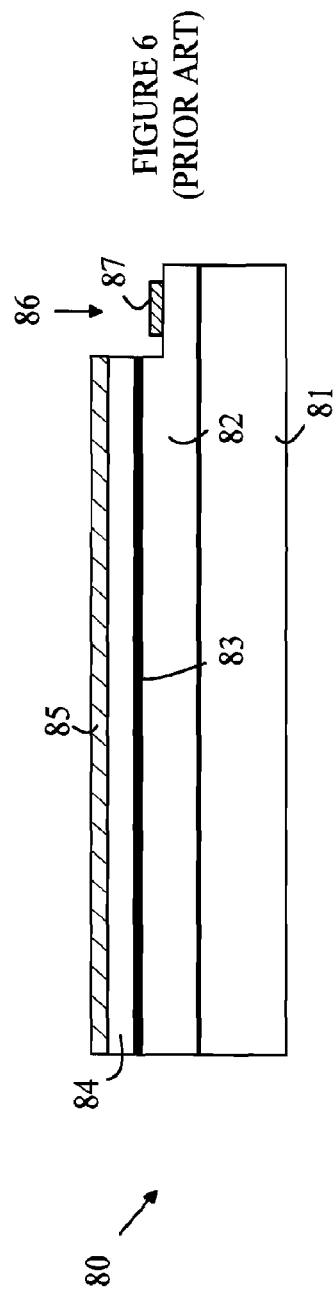
FIGS. 6-8 are cross-sectional views of a portion of a wafer on which an LED according to another embodiment of the present invention is fabricated at various stages in the fabrication process.

The above-described embodiments of the present invention utilize a vertical LED structure in which one electrode is on the bottom of the final LED structure and the other electrode used to power the LED is on the top of the final LED structure. However, the present invention can be utilized to construct LEDs having both electrodes on the top surface of the LED. Refer now to FIG. 6, which is a cross-sectional view of a conventional LED 80 having both electrodes on the top surface of the LED. LED 80 is constructed by growing a number of n-type layers 82, and active layers 83, and a number of p-type layers 84 on a substrate 81 in a manner analogous to that described above. After the layers are grown, a mesa 86 is etched in the layer stack such that the bottom surface of the mesa is within the n-type layers and below the active layer. Electrodes 85 and 87 are then deposited to provide electrical contacts to the n-type and p-type layers.

Figure 7:
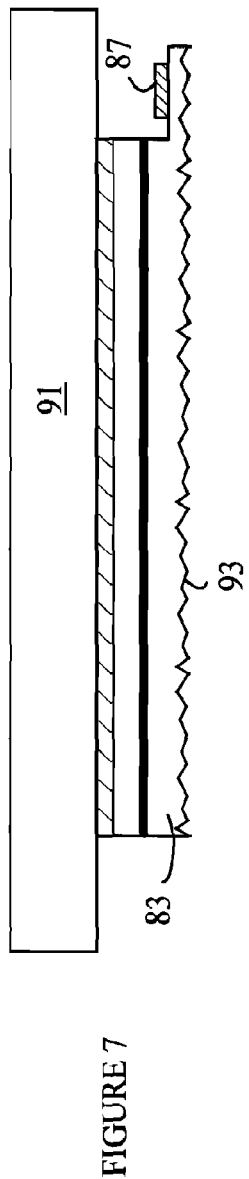

LED 80 can be thinned in a manner analogous to that described above. Refer now to FIG. 7, which is a cross-sectional view of a wafer containing LED 80 after the wafer has been thinned. The wafer containing LED 80 is bonded to a temporary carrier wafer 91 and the substrate is thinned in a manner analogous to that discussed above. The exposed n-type layer can be optionally roughened as shown at 93.

Carrier wafer 91 could be of any construction that provides sufficient structural strength to allow the thinning and handling of the wafer containing LED 80. Carrier wafer 91 is bonded to the wafer containing LED 80 utilizing a reversible bonding agent such as paraffin to allow carrier wafer 91 to be removed.

Figure 8:
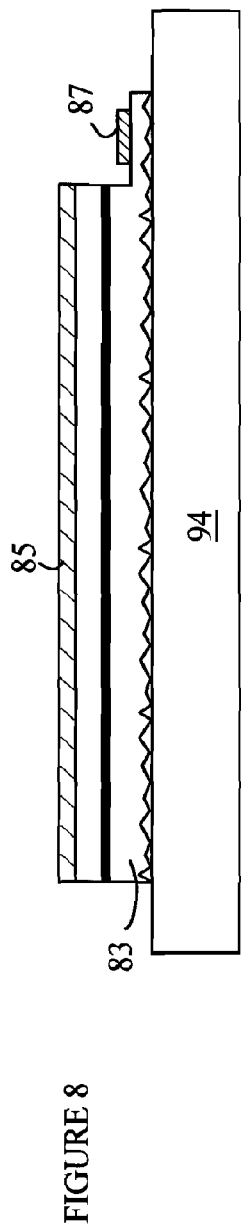

The thinned and roughened layer is then bonded to a new substrate 94 as shown in FIG. 8, which is a cross-sectional view of the wafer containing LED 80 after LED 80 has been bonded to the new substrate and carrier wafer 91 has been removed. Substrate 94 can be bonded to the roughened surface using an adhesive that is either transparent or reflective. If a transparent adhesive is utilized, then the top surface of substrate 94 is preferably reflective if light is to be extracted through electrode 85.

Substrate 94 could be constructed from a number of materials. In general, a material that has a coefficient of thermal expansion that is near that of the GaN is preferred to reduce the stresses on the LED during temperature cycling. In addition, a substrate that has a good thermal conductivity is also preferred in applications in which the power generated by the LED is sufficient to cause heating of the LED. Finally, a substrate that can be cut or thinned using conventional processing equipment is also advantageous. Substrates that are satisfactory in terms of these criteria include silicon, sapphire, molybdenum, and tungsten-copper alloys.

The above-described embodiments of the present invention are directed to LEDs that are constructed from the GaN family of materials. For the purpose of this discussion, the GaN family of materials is defined to include any alloy in the InAlGaN system. Hence, the term GaN is defined to include any alloy in this system.

The above-described embodiments utilize a carrier such as carrier 51 to hold the LED layers. The carrier can be constructed from a silicon wafer to take advantage of the well-developed fabrication techniques that are available for such carriers. However, any suitable material can be utilized, since issues of lattice mismatch are not present for the carrier.

Various modifications to the present invention will become apparent to those skilled in the art from the foregoing description and accompanying drawings. Accordingly, the present invention is to be limited solely by the scope of the following claims.

What is claimed is:

1. A semiconductor light-emitting device comprising:
   a carrier;
   a semiconductor light-emitting structure bonded to said carrier and comprising an active layer sandwiched between a first GaN layer comprising a p-type GaN layer and a second GaN layer comprising an n-type GaN layer, said active layer emitting light of a predetermined wavelength in said active layer when electrons and holes from said n-type GaN layer and said p-type GaN layer, respectively, combine therein; and
   a first electrode attached to a surface of said first GaN layer that is not adjacent to said active layer and a second electrode attached to said second GaN layer;
   wherein said second GaN layer has a thickness greater than 0.5 µm and an average thickness less than 1.25 µm; and
   wherein said carrier is bonded to said first electrode; and
   wherein said carrier comprises a layer of electrically conducting material.

2. A semiconductor light-emitting device comprising:
   a carrier;
   a semiconductor light-emitting structure bonded to said carrier and comprising an active layer sandwiched between a first GaN layer comprising a p-type GaN layer and a second GaN layer comprising an n-type GaN layer, said active layer emitting light of a predetermined wavelength in said active layer when electrons and holes from said n-type GaN layer and said p-type GaN layer, respectively, combine therein; and
   a first electrode attached to a surface of said first GaN layer that is not adjacent to said active layer and a second electrode attached to said second GaN layer;
   wherein said second GaN layer has an average thickness less than 1.25 µm; and
   wherein said carrier is bonded to said first electrode; and
   wherein said carrier comprises a carrier electrode bonded to a surface of said carrier that is not bonded to said first electrode.

3. The semiconductor light-emitting device of claim 1 wherein said electrically conducting layer comprises copper and/or tungsten.

* * * * *